(12) United States Patent
Wang et al.

(10) Patent No.: US 11,549,086 B2
(45) Date of Patent: Jan. 10, 2023

(54) CLEANING AGENT AND PREPARATION METHOD AND USE THEREOF

(71) Applicant: SHANGHAI SINYANG SEMICONDUCTOR MATERIALS CO., LTD., Shanghai (CN)

(72) Inventors: Su Wang, Shanghai (CN); Chuang Jiang, Shanghai (CN); Qiangqiang Feng, Shanghai (CN)

(73) Assignee: SHANGHAI SINYANG SEMICONDUCTOR MATERIALS CO., LTD., Shanghai (CN)

( * ) Notice: Subject to any disclaimer, the term of this patent is extended or adjusted under 35 U.S.C. 154(b) by 719 days.

(21) Appl. No.: 16/488,001

(22) PCT Filed: Dec. 15, 2017

(86) PCT No.: PCT/CN2017/116442
§ 371 (c)(1),
(2) Date: Aug. 22, 2019

(87) PCT Pub. No.: WO2019/019533
PCT Pub. Date: Jan. 31, 2019

(65) Prior Publication Data
US 2021/0130750 A1    May 6, 2021

(30) Foreign Application Priority Data
Jul. 25, 2017  (CN) .......................... 201710613216.9

(51) Int. Cl.
| | | |
|---|---|---|
| *C11D 7/50* | (2006.01) | |
| *C11D 11/00* | (2006.01) | |
| *B08B 3/08* | (2006.01) | |
| *B08B 3/12* | (2006.01) | |
| *C11D 1/00* | (2006.01) | |
| *C11D 1/22* | (2006.01) | |
| *C11D 3/00* | (2006.01) | |
| *C11D 3/04* | (2006.01) | |
| *C11D 3/26* | (2006.01) | |
| *C11D 3/28* | (2006.01) | |
| *C11D 3/34* | (2006.01) | |
| *C11D 3/39* | (2006.01) | |
| *C11D 3/43* | (2006.01) | |
| *G03F 7/42* | (2006.01) | |
| *H01L 21/02* | (2006.01) | |
| *H01L 23/532* | (2006.01) | |

(52) U.S. Cl.
CPC ............ *C11D 11/0047* (2013.01); *B08B 3/08* (2013.01); *B08B 3/12* (2013.01); *C11D 1/008* (2013.01); *C11D 1/22* (2013.01); *C11D 3/0073* (2013.01); *C11D 3/042* (2013.01); *C11D 3/046* (2013.01); *C11D 3/26* (2013.01); *C11D 3/28* (2013.01); *C11D 3/349* (2013.01); *C11D 3/3942* (2013.01); *C11D 3/3947* (2013.01); *C11D 3/43* (2013.01); *G03F 7/423* (2013.01); *H01L 21/02071* (2013.01); *H01L 23/53214* (2013.01); *H01L 23/53228* (2013.01)

(58) Field of Classification Search
CPC .................................................. C11D 11/0047
USPC .......................................................... 510/175
See application file for complete search history.

(56) References Cited

U.S. PATENT DOCUMENTS

| | | |
|---|---|---|
| 2008/0125342 A1 | 5/2008 | Visintin et al. |
| 2013/0303420 A1 | 11/2013 | Cooper et al. |
| 2014/0371124 A1 | 12/2014 | Harada et al. |
| 2016/0208201 A1 | 7/2016 | Kumagai et al. |
| 2017/0200601 A1* | 7/2017 | Song ........................ C11D 7/28 |
| 2017/0335248 A1 | 11/2017 | Oie et al. |

FOREIGN PATENT DOCUMENTS

| | | |
|---|---|---|
| CN | 101286016 A | 10/2008 |
| CN | 101681130 A | 3/2010 |
| CN | 101366107 B | 8/2011 |
| CN | 102061228 B | 2/2013 |
| CN | 103003923 A | 3/2013 |
| CN | 101923294 B | 12/2013 |
| CN | 105431506 A | 3/2016 |
| CN | 105739251 A | 7/2016 |

(Continued)

OTHER PUBLICATIONS

International Search Report and Written Opinion of PCT/CN2017/116442 dated Mar. 27, 2018.

(Continued)

*Primary Examiner* — Gregory E Webb

(74) *Attorney, Agent, or Firm* — Harness, Dickey & Pierce, P.L.C.

(57) ABSTRACT

Provided are a cleaning agent and a preparation method and the use thereof. The cleaning agent is prepared from the following raw materials comprising the following mass fraction of components: 0.5%-20% of an oxidant containing iodine, 0.5%-20% of an etchant containing boron, 1%-50% of a pyrrolidinone solvent, 1%-20% of a corrosion inhibitor, 0.01%-5% of a metal ion-free surfactant, and water, with the sum of the mass fraction of each component being 100%, the pH of the cleaning agent is 7.5-13.5, and the corrosion inhibitor is one or more of a benzotriazole corrosion inhibitor, a hydrazone corrosion inhibitor, a carbazone corrosion inhibitor and a thiocarbohydrazone corrosion inhibitor. The cleaning agent can efficiently remove nitrides from hard mask residues with little effects on metals and low-κ dielectric materials, and has a good selectivity.

13 Claims, No Drawings

(56) References Cited

FOREIGN PATENT DOCUMENTS

| CN | 105874568 A | 8/2016 |
|----|---|---|
| CN | 106226991 A | 12/2016 |
| CN | 107357143 A | 11/2017 |
| JP | 2013229569 A | 11/2013 |
| TW | I525701 B | 3/2016 |
| TW | 201619362 A | 6/2016 |
| WO | WO-2012009639 A2 | 1/2012 |
| WO | WO-2013025619 A2 | 2/2013 |
| WO | WO-2016042408 A2 | 3/2016 |

OTHER PUBLICATIONS

First Office Action and Search Report of Chinese priority application No. 201710613216.9 dated Mar. 14, 2018.

\* cited by examiner

CLEANING AGENT AND PREPARATION METHOD AND USE THEREOF

CROSS-REFERENCE TO RELATED APPLICATIONS

This application is a 371 National Phase of PCT/CN2017/116442, filed on Dec. 15, 2017, which claims the benefit of Chinese Patent Application No. CN201710613216.9, filed on Jul. 25, 2017. The entire disclosures of the above applications are incorporated herein by reference.

FIELD OF THE INVENTION

The present invention relates to a cleaning agent, preparation method and use thereof.

PRIOR ARTS

Photolithography is used to pattern the image on the device wafer during dual damascene processing of integrated circuits. Photolithographic techniques comprise the steps of coating, exposure and developing. The wafer is coated with a positive or negative photoresist and then covered with a mask which defines the pattern to be retained or removed in the subsequent process. After the mask is properly placed, it is exposed to a bundle of monochromatic radiation, such as ultraviolet (UV) light or deep UV (DUV) light (≈250 nm or 193 nm), which allows the exposed photoresist more or less soluble in the selected rinse solution. The soluble photoresist is then removed or "developed" to leave the same pattern as the mask.

Subsequently, vapor phase plasma etching is used to transfer the developed photoresist coating pattern to the underlying layer, comprising a hard mask, an interlayer dielectric, and/or an etch stop layer. Residues after plasma etching are generally deposited on the structure of the wiring on the back end. The residues may hamper the subsequent silicidation or connection formation if not removed. The residues after plasma etching and ashing generally comprise hard mask residues, polymer residues, other particles and the like. The cleaning agent should have high selectivity in cleaning the residues after plasma etching and ashing. For example, the nitride of the hard mask residues can be efficiently removed on the condition of relatively small influence on metal and low-k dielectric materials. With the continuous reduction of critical size of the equipment and the increasing requirements for the high production efficiency and reliable equipment performance, such improved cleaning compositions are needed.

Currently, there are many patents for the cleaning agents used to selectively remove the etching masks containing Ti, W and Ta, which are shown in the following table:

| Publication Number | Applicants |
| --- | --- |
| CN102061228B | AVANTOR PERFORMANCE MAT INC. |
| CN101923294B | AVANTOR PERFORMANCE MAT INC. |
| CN101366107B | Advanced Tech Materials |
| CN103003923A | Advanced Tech Materials |
| CN105431506A | Advanced Tech Materials |
| TWI525701B | EKC TECH INC. |
| CN105874568A | EKC TECH INC. |
| CN105739251A | AIR PRODUCTS & CHEMICALS |

Although various cleaning selectivity is disclosed in these patents, the cleaning agents disclosed in these patents have poor effects on the cleaning effects and the removal selectivity of the tantalum nitride in etching hard mask. In particular, the claims of the patent application No. CN105874568A of EKC Technology, Inc. explicitly states that the cleaning compositions can selectively remove tantalum nitride, but no etching experimental data relating to tantalum nitride is given in the description of the invention. The inventors of the present invention conducted experiments using various formulations within the scope of their protection, and found that their compositions and cleaning methods have good effect on the selective removal of the etching masks containing Ti and W, but poor effect on the removal of the etching mask materials containing Ta (such as tantalum nitride). This will seriously affect the cleaning effect of the cleaning agent.

Therefore, there is an urgent need to develop a cleaning agent that is capable of selectively removing the nitride etching mask, while being compatible with Cu, Co, Ta, W, Ti and low-k materials, and must effectively remove the residues of ashing and etching simultaneously.

CONTENT OF THE PRESENT INVENTION

The technical problem to be solved by the present invention is to overcome the defects that the prior cleaning agents cannot remove the tantalum-containing etching mask material (such as tantalum nitride) effectively, and to provide a cleaning agent, preparation method and use thereof. The cleaning agent of the present invention can efficiently remove the nitride of the hard mask residues on the condition of having relatively small influence on metal and low-k dielectric materials, and the cleaning agent is good in selectivity and has very broad market application prospect.

The present invention mainly solves the above technical problems by the following technical means:

The present invention provides a cleaning agent which is prepared from the raw materials comprising the following mass fraction of components: 0.5%-20% of an oxidant containing iodine, 0.5%-20% of an etchant containing boron, 1%-50% of a pyrrolidinone solvent, 1%-20% of a corrosion inhibitor, 0.01%-5% of a metal ion-free surfactant, and water, with the sum of the mass fraction of each component being 100%; the pH of the cleaning agent is 7.5-13.5; the corrosion inhibitor is selected from the group consisting of a benzotriazole corrosion inhibitor, a hydrazone corrosion inhibitor, a carbazone corrosion inhibitor and a thiocarbazone corrosion inhibitor.

Wherein, the mass fraction of the oxidant containing iodine is preferably 1%-10%, more preferably 1.5%-5%. The mass fraction of the etchant containing boron is preferably 1%-10%, more preferably 1.5%-5%. The mass fraction of the pyrrolidinone solvent is preferably 5%-35%, more preferably 10%-30%. The mass fraction of the corrosion inhibitor is preferably 3%-15%, more preferably 5%-10%. The mass fraction of the surfactant is preferably 0.1%-4%, more preferably 0.2%-3%. The pH of the cleaning agent is preferably 8-12, more preferably 9-11.

Wherein, in the cleaning agent, the sum of the mass fraction of each component is 100%. Therefore, the amount of water used is preferably such that the sum of the mass fraction of each component reaches 100%.

Wherein, the oxidant containing iodine is preferably selected from of the group consisting of iodic acid, iodate, periodic acid and periodate. The iodate is preferably ammonium iodate and/or tetramethylammonium iodate. The periodate is preferably ammonium periodate and/or tetramethylammonium periodate.

Wherein, the etchant containing boron is the etchant containing boron acceptable in the art, and preferably selected from the group consisting of tetrafluoroboric acid, ammonium tetrafluoroborate, tetramethylammonium tetrafluoroborate, tetraethylammonium tetrafluoroborate, tetrapropylammonium tetrafluoroborate and tetrabutylammonium tetrafluoroborate.

Wherein, the pyrrolidinone solvent is the pyrrolidinone solvent acceptable in the art, and preferably N-hydrogen pyrrolidinone solvent. The N-hydrogen pyrrolidinone solvent is preferably selected from the group consisting of N-methylpyrrolidinone, N-ethylpyrrolidinone, N-cyclohexylpyrrolidinone, and N-hydroxyethylpyrrolidinone.

Wherein, the benzotriazole corrosion inhibitor is preferably selected from the group consisting of benzotriazole, methylbenzotriazole and 5-carboxybenzotriazole. The hydrazone corrosion inhibitor is preferably acetophenone phenylhydrazone. The thiocarbazone corrosion inhibitor is preferably diphenylthiocarbazone.

Wherein the metal ion-free surfactant is the metal ion-free surfactant acceptable in the art, and preferably polyvinylpyrrolidinone and/or dodecylbenzenesulfonic acid.

The pH can be adjusted according to the components and contents in the cleaning agent. For example, an organic acid, an inorganic acid, an inorganic base, a salt of strong alkali weak acid or a buffer solution or the mixture thereof can be used. To prevent the pH of the degumming agent from fluctuating drastically, the buffer solution acceptable in the art can be used. The organic acid is preferably citric acid. The inorganic acid is preferably boric acid. The salt of strong alkali weak acid is preferably tetramethylammonium hydroxide.

Wherein, the water is preferably one or more (for example, two kinds) of deionized water, distilled water, pure water, and ultrapure water.

In a preferred embodiment of the present invention, the cleaning agent is prepared from the raw materials consisting of 0.5%-20% of oxidant containing iodine, 0.5%-20% of etchant containing boron, 1%-50% of pyrrolidinone solvent, 1%-20% of corrosion inhibitor, 0.01%-5% of metal ion-free surfactant and water, with the sum of the mass fraction of each component being 100%; the pH of the cleaning agent is 7.5-13.5; the corrosion inhibitor is selected from the group consisting of a benzotriazole corrosion inhibitor, a hydrazone corrosion inhibitor, a carbazone corrosion inhibitor and a thiocarbazone corrosion inhibitor. In a preferred embodiment of the present invention, the cleaning agent is prepared from the raw materials consisting of 1%-10% of oxidant containing iodine, 1%-10% of etchant containing boron, 5%-35% of pyrrolidone solvent, 3%-15% of corrosion inhibitor, 0.1%-4% of metal ion-free surfactant and water, with the sum of the mass fraction of each component being 100%; the pH of the cleaning agent is 8-12; the corrosion inhibitor is selected from the group consisting of a benzotriazole corrosion inhibitor, a hydrazone corrosion inhibitor, a carbazone corrosion inhibitor and a thiocarbazone corrosion inhibitor.

In a preferred embodiment of the present invention, the cleaning agent is prepared from the raw materials consisting of 1.5%-5% of oxidant containing iodine, 10%-30% of etchant containing boron, 10%-30% of pyrrolidinone solvent, 5%-10% of corrosion inhibitor, 0.2%-3% of metal ion-free surfactant and water, with the sum of the mass fraction of each component being 100%; the pH of the cleaning agent is 9-11; the corrosion inhibitor is selected from the group consisting of a benzotriazole corrosion inhibitor, a hydrazone corrosion inhibitor, a carbazone corrosion inhibitor and a thiocarbazone corrosion inhibitor.

The present invention also provides a method for preparing the cleaning agent, comprising mixing the raw materials. The mixing is preferably carried out by adding the solid components of the raw materials to the liquid components and stirring uniformly. The mixing temperature is room temperature. After mixing, it preferably comprises further steps of vibration and filtration. The purpose of vibration is to sufficiently mix the raw materials, and the vibration speed and time are not limited. The purpose of filtration is to remove the insolubles.

The present invention also provides a use of the cleaning agent in cleaning an etched and ashed semiconductor chip. The semiconductor chip is preferably a semiconductor chip of a copper interconnect structure or an aluminum interconnect structure.

The use preferably comprises contacting the etched and ashed semiconductor chip with the etching cleaning agent. More preferably, the use comprises: contacting the etched and ashed semiconductor chip with the etching cleaning agent followed by vibration, washing, and drying.

The contacting temperature is preferably 10-90° C., preferably 20-60° C., for example 40-45° C. The operation of the contacting is preferably immersing the etched and ashed semiconductor chip in the cleaning liquid. The vibration is preferably carried out in a vortex mixer with constant temperature. The vibration temperature is preferably 10-90° C., preferably 20-60° C., for example 40-45° C. The washing is preferably washing with water (for example one or more of deionized water, distilled water, pure water and ultrapure water). The drying method is preferably blowing dry with high purity nitrogen.

In the present invention, the room temperature refers to 10-30° C.

Based on the common knowledge in the art, various preferred conditions as defined above can be optionally combined to obtain preferred embodiments of the present invention.

The reagents and raw materials used in the present invention are commercially available.

The positive progress of the present invention is that the cleaning agent prepared by the method of the present invention can efficiently remove the nitride on the condition of having relatively small influence on metal and low-k dielectric materials, and the cleaning agent is good in selectivity and has very wide market application prospect, which does not only solves the problem for microelectronics enterprises and promotes the development of microelectronics industry, but also has high economic benefits.

EMBODIMENT

In the following embodiments and comparative embodiments, the method for preparing the cleaning agent comprises mixing the corresponding raw materials.

In the following embodiments, the operations are all carried out at room temperatures unless otherwise specified.

Embodiments 1-10

TABLE 1

Components of the cleaning agent

| No. | Oxidant containing iodine Type | Etchant containing boron Type | Pyrrolidinone solvent Type | Corrosion inhibitor Type | Metal ion-free surfactant Type |
|---|---|---|---|---|---|
| 1 | Periodic acid | Tetrafluoroboric acid | N-methylpyrrolidinone | Benzotriazole | Polyvinyl pyrrolidone |
| 2 | Tetramethylammonium periodate | Ammonium tetrafluoroborate | N-ethylpyrrolidinone | Methylbenzotriazole | Polyvinyl pyrrolidone |
| 3 | Ammonium periodate | Tetrabutylammonium tetrafluoroborate | N-cyclohexylpyrrolidinone | 5-carboxybenzotriazole | Dodecyl benzenesulfonic acid |
| 4 | Iodic acid | Tetramethylammonium tetrafluoroborate | N-hydroxyethylpyrrolidinone | Acetophenone phenylhydrazone | Polyvinyl pyrrolidone |
| 5 | Ammonium iodate | Tetraethylammonium tetrafluoroborate | N-methylpyrrolidinone | Diphenylthiocarbazone | Dodecyl benzenesulfonic acid |
| 6 | Tetramethylammonium iodate | Tetrapropylammonium tetrafluoroborate | N-ethylpyrrolidinone | Benzotriazole | Dodecyl benzenesulfonic acid |
| 7 | Periodic acid | Tetrafluoroboric acid | N-methylpyrrolidinone | Benzotriazole | Polyvinyl pyrrolidone |
| 8 | Periodic acid | Tetrafluoroboric acid | N-methylpyrrolidinone | Benzotriazole | Polyvinyl pyrrolidone |
| 9 | Periodic acid | Tetrafluoroboric acid | N-methylpyrrolidinone | Benzotriazole | Polyvinyl pyrrolidone |
| 10 | Periodic acid | Tetrafluoroboric acid | N-methylpyrrolidinone | Benzotriazole | Polyvinyl pyrrolidone |

TABLE 2

Mass fraction of each component and the pH of the cleaning agent

| No. | Oxidant containing iodine | Etchant containing boron | Pyrrolidone solvent | Corrosion inhibitor | Metal ion-free surfactant | Water | pH |
|---|---|---|---|---|---|---|---|
|  | Mass fraction % |  |  |  |  |  |  |
| 1 | 1.5 | 1.5 | 10 | 5 | 0.2 | 81.8 | 9 |
| 2 | 1 | 1 | 15 | 6 | 0.5 | 76.5 | 9.5 |
| 3 | 2 | 4 | 20 | 7 | 1 | 68 | 9.2 |
| 4 | 3 | 2 | 25 | 8 | 2 | 59 | 10 |
| 5 | 4 | 3 | 27 | 9 | 2.5 | 53.5 | 10.5 |
| 6 | 5 | 5 | 30 | 10 | 3 | 47 | 11 |
| 7 | 0.5 | 0.5 | 1 | 1 | 0.01 | 96.99 | 9 |
| 8 | 1 | 1 | 5 | 3 | 0.1 | 89.9 | 9 |
| 9 | 10 | 10 | 50 | 20 | 4 | 6 | 9 |
| 10 | 20 | 20 | 35 | 15 | 5 | 5 | 9 |

Comparative Embodiments 1-33

TABLE 3

Components of the cleaning agent

| No. | Oxidant containing iodine Type | Etchant containing boron Type | Pyrrolidinone solvent Type | Corrosion inhibitor Type | Metal ion-free surfactant Type |
|---|---|---|---|---|---|
| 1 | Periodic acid | Tetrafluoroboric acid | N-methylpyrrolidinone | Benzotriazole | Polyvinyl pyrrolidone |
| 2 | Periodic acid | Tetrafluoroboric acid | N-methylpyrrolidinone | Benzotriazole | Polyvinyl pyrrolidone |
| 3 | Periodic acid | Tetrafluoroboric acid | N-methylpyrrolidinone | Benzotriazole | Polyvinyl pyrrolidone |
| 4 | Tetramethylammonium periodate | Ammonium tetrafluoroborate | N-ethylpyrrolidinone | Methylbenzotriazole | Polyvinyl pyrrolidone |
| 5 | Ammonium periodate | Tetrabutylammonium tetrafluoroborate | N-cyclohexylpyrrolidinone | 5-carboxybenzotriazole | Dodecyl benzene sulfonic acid |

TABLE 3-continued

Components of the cleaning agent

| No. | Oxidant containing iodine Type | Etchant containing boron Type | Pyrrolidinone solvent Type | Corrosion inhibitor Type | Metal ion-free surfactant Type |
|---|---|---|---|---|---|
| 6 | Iodic acid | Tetramethylammonium tetrafluoroborate | N-hydroxyethylpyrrolidinone | 1-hydroxybenzotriazole | Polyvinyl pyrrolidone |
| 7 | Ammonium iodate | Tetraethylammonium tetrafluoroborate | N-methylpyrrolidinone | 4-carboxybenzotriazole | Dodecyl benzene sulfonic acid |
| 8 | Tetramethylammonium iodate | Tetrapropylammonium tetrafluoroborate | N-ethylpyrrolidinone | Benzotriazole | Dodecyl benzene sulfonic acid |
| 9 | Periodic acid | Tetrafluoroboric acid | N-methylpyrrolidinone | Benzotriazole | Polyvinyl pyrrolidone |
| 10 | Tetramethylammonium periodate | Ammonium tetrafluoroborate | N-ethylpyrrolidinone | Methylbenzotriazole | Polyvinyl pyrrolidone |
| 11 | Ammonium periodate | Tetrabutylammonium tetrafluoroborate | N-cyclohexylpyrrolidinone | 5-carboxybenzotriazole | Dodecyl benzene sulfonic acid |
| 12 | Iodic acid | Tetramethylammonium tetrafluoroborate | N-hydroxyethylpyrrolidinone | 1-hydroxybenzotriazole | Polyvinyl pyrrolidone |
| 13 | Ammonium iodate | Tetraethylammonium tetrafluoroborate | N-methylpyrrolidinone | 4-carboxybenzotriazole | Dodecyl benzene sulfonic acid |
| 14 | Tetramethylammonium iodate | Tetrapropylammonium tetrafluoroborate | N-ethylpyrrolidinone | Benzotriazole | Dodecyl benzene sulfonic acid |
| 15 | Hydrogen peroxide | Tetrafluoroboric acid | N-methylpyrrolidinone | Benzotriazole | Polyvinyl pyrrolidone |
| 16 | Ammonium persulfate | Tetrafluoroboric acid | N-methylpyrrolidinone | Benzotriazole | Polyvinyl pyrrolidone |
| 17 | Peracetic acid | Tetrafluoroboric acid | N-methylpyrrolidinone | Benzotriazole | Polyvinyl pyrrolidone |
| 18 | Ammonium chlorite | Tetrafluoroboric acid | N-methylpyrrolidinone | Benzotriazole | Polyvinyl pyrrolidone |
| 19 | Ammonium perborate | Tetrafluoroboric acid | N-methylpyrrolidinone | Benzotriazole | Polyvinyl pyrrolidone |
| 20 | Nitric acid | Tetrafluoroboric acid | N-methylpyrrolidinone | Benzotriazole | Polyvinyl pyrrolidone |
| 21 | Tetramethylammonium chlorate | Tetrafluoroboric acid | N-methylpyrrolidinone | Benzotriazole | Polyvinyl pyrrolidone |
| 22 | Periodic acid | Hydrofluoric acid | N-methylpyrrolidinone | Benzotriazole | Polyvinyl pyrrolidone |
| 23 | Periodic acid | Fluorosilicic acid | N-methylpyrrolidinone | Benzotriazole | Polyvinyl pyrrolidone |
| 24 | Periodic acid | Ammonium fluorosilicate | N-methylpyrrolidinone | Benzotriazole | Polyvinyl pyrrolidone |
| 25 | Periodic acid | Ammonium hydrogen fluoride | N-methylpyrrolidinone | Benzotriazole | Polyvinyl pyrrolidone |
| 26 | Periodic acid | Tetramethylammonium fluoride | N-methylpyrrolidinone | Benzotriazole | Polyvinyl pyrrolidone |
| 27 | Periodic acid | Trishydroxyethylammonium fluoride | N-methylpyrrolidinone | Benzotriazole | Polyvinyl pyrrolidone |
| 28 | Periodic acid | Tetrafluoroboric acid | Ethylene glycol | Benzotriazole | Polyvinyl pyrrolidone |
| 29 | Periodic acid | Tetrafluoroboric acid | Sulfolane | Benzotriazole | Polyvinyl pyrrolidone |
| 30 | Periodic acid | Tetrafluoroboric acid | N-methylpyrrolidinone | 1,2-dihydroxyphenol | Polyvinyl pyrrolidone |
| 31 | Periodic acid | Tetrafluoroboric acid | N-methylpyrrolidinone | Pyrogallol | Polyvinyl pyrrolidone |
| 32 | Periodic acid | Tetrafluoroboric acid | N-methylpyrrolidinone | Benzotriazole | Sodium isooctyl sulfate |
| 33 | Periodic acid | Tetrafluoroboric acid | N-methylpyrrolidinone | Benzotriazole | Sodium dodecyl benzene sulfonate |

TABLE 4

Mass fraction of each component and the pH of the cleaning agent

| No | Oxidant containing iodine | Etchant containing boron | Pyrrolidinone solvent Mass fraction % | Corrosion inhibito | Metal ion-free surfactant | Water | pH |
|---|---|---|---|---|---|---|---|
| 1 | 0.1 | 21 | 0.5 | 0.5 | 0 | 77.9 | 9 |
| 2 | 21 | 0.1 | 51 | 21 | 6 | 0.9 | 9 |
| 3 | 0 | 1.5 | 10 | 5 | 0.2 | 83.3 | 9 |
| 4 | 0 | 1 | 15 | 6 | 0.5 | 77.5 | 9.5 |
| 5 | 0 | 2 | 20 | 7 | 1 | 70 | 9.2 |
| 6 | 0 | 3 | 25 | 8 | 2 | 62 | 10 |
| 7 | 0 | 4 | 27 | 9 | 2.5 | 57.5 | 10.5 |
| 8 | 0 | 5 | 30 | 10 | 3 | 52 | 11 |
| 9 | 1.5 | 0 | 10 | 5 | 0.2 | 83.3 | 9 |
| 10 | 1 | 0 | 15 | 6 | 0.5 | 77.5 | 9.5 |
| 11 | 2 | 0 | 20 | 7 | 1 | 70 | 9.2 |
| 12 | 3 | 0 | 25 | 8 | 2 | 62 | 10 |
| 13 | 4 | 0 | 27 | 9 | 2.5 | 57.5 | 10.5 |
| 14 | 5 | 0 | 30 | 10 | 3 | 52 | 11 |
| 15 | 1.5 | 1.5 | 10 | 5 | 0.2 | 81.8 | 9 |
| 16 | 2.5 | 2.5 | 11 | 6 | 0.2 | 81.8 | 9 |
| 17 | 3.5 | 3.5 | 12 | 7 | 0.2 | 81.8 | 9 |
| 18 | 4.5 | 4.5 | 13 | 8 | 0.2 | 81.8 | 9 |
| 19 | 5.5 | 5.5 | 14 | 9 | 0.2 | 81.8 | 9 |
| 20 | 6.5 | 6.5 | 15 | 10 | 0.2 | 81.8 | 9 |
| 21 | 7.5 | 7.5 | 16 | 11 | 0.2 | 81.8 | 9 |
| 22 | 1.5 | 1.5 | 10 | 5 | 0.2 | 81.8 | 9 |
| 23 | 1.5 | 1.5 | 10 | 5 | 0.2 | 81.8 | 9 |
| 24 | 1.5 | 1.5 | 10 | 5 | 0.2 | 81.8 | 9 |
| 25 | 1.5 | 1.5 | 10 | 5 | 0.2 | 81.8 | 9 |
| 26 | 1.5 | 1.5 | 10 | 5 | 0.2 | 81.8 | 9 |
| 27 | 1.5 | 1.5 | 10 | 5 | 0.2 | 81.8 | 9 |
| 28 | 1.5 | 1.5 | 10 | 5 | 0.2 | 81.8 | 9 |
| 29 | 1.5 | 1.5 | 10 | 5 | 0.2 | 81.8 | 9 |
| 30 | 1.5 | 1.5 | 10 | 5 | 0.2 | 81.8 | 9 |
| 31 | 1.5 | 1.5 | 10 | 5 | 0.2 | 81.8 | 9 |
| 32 | 1.5 | 1.5 | 10 | 5 | 0.2 | 81.8 | 9 |
| 33 | 1.5 | 1.5 | 10 | 5 | 0.2 | 81.8 | 9 |

Among the above embodiments, Comparative embodiments 1-2 explored the upper limit of the amount of each component. Comparative embodiments 3-8 explored the effect without adding the oxidant containing iodine. Comparative embodiments 9-14 explored the effect without adding the etchant containing boron. Comparative embodiments 15-21 explored the effect of using the oxidizing agents other than the oxidant containing iodine. Comparative embodiments 22-27 explored the effects of using the etchant other than the etchant containing boron. Comparative embodiments 28-29 explored the effect of using the organic solvents other than the pyrrolidinone. Comparative embodiments 30-31 explored the effects of using the corrosion inhibitors other than corrosion inhibitors in the components of the present invention. Comparative embodiments 32-33 explored the effect of using surfactants containing metal ions.

Effect Embodiments

Testing Procedures:

Various wafers (with various nitrides, metals, dielectric materials deposited on the silicon wafer, each having a material layer thickness of 1000 Å) were immersed in the cleaning agent at 50° C. for 15 minutes. The thickness of the wafers was measured before and after the immersion treatment, wherein the thickness of TiN, TaN, WN, Cu, Co, Ta, Ti, and W was measured by Four Dimensions Four Point Probe Meter 333A, and the thickness of TEOS was measured by an Auto SE Spectroscopic Ellipsometer from HORIBA JOBIN YVON. The etching rate was calculated as the change of the thickness (before and after chemical treatment) divided by the chemical treatment time. The pH of the chemical solution was measured using a Beckman 260 pH/Temp/mV meter. The cleaning liquids were used to clean the plasma etched and ashed copper interconnect chips at 50° C., and the residue removal effect was evaluated by SEM results (Hitachi S-5500).

The test results are shown in Table 5.

Etching rate (at 50° C.) in Å/min.

TABLE 5

| / | TaN | TiN | WN | Cu | Co | Ta | W | Ti | TEOS | Cleaning effect |
|---|---|---|---|---|---|---|---|---|---|---|
| / | 40-100 | 100-200 | 60-100 | 0-2 | 0-1 | 0-1 | 0-1 | 0-1 | 0-1 | ☺ |
| Application effect embodiment 1 | 46 | 156.1 | 75.8 | 1.8 | 0.2 | 0.8 | 0.2 | 0.4 | 0.5 | ☺ |
| Application effect embodiment 2 | 54.1 | 116.6 | 90.3 | 0.7 | 0.4 | 0.4 | 0.3 | 0.2 | 0.3 | ☺ |
| Application effect embodiment 3 | 60.2 | 137 | 72.1 | 1.8 | 0.6 | 1 | 0.2 | 0.2 | 0.5 | ☺ |

TABLE 5-continued

| / | TaN | TiN | WN | Cu | Co | Ta | W | Ti | TEOS | Cleaning effect |
|---|---|---|---|---|---|---|---|---|---|---|
| Application effect embodiment 4 | 91.1 | 102.2 | 87.1 | 1.2 | 0.7 | 0 | 0 | 0.3 | 0.9 | ◎ |
| Application effect embodiment 5 | 91.5 | 134.7 | 85.9 | 0.4 | 0.6 | 0.2 | 1 | 1 | 0.9 | ◎ |
| Application effect embodiment 6 | 69.6 | 100.3 | 96.4 | 0.6 | 0.2 | 0.3 | 0.9 | 1 | 0 | ◎ |
| Application effect embodiment 7 | 54.1 | 111.9 | 72 | 1.7 | 0 | 1 | 0.7 | 0.1 | 1 | ◎ |
| Application effect embodiment 8 | 50.8 | 191.8 | 73.2 | 1.3 | 0.1 | 0.7 | 0.2 | 0.5 | 0.9 | ◎ |
| Application effect embodiment 9 | 73.3 | 186.6 | 92.4 | 1.8 | 0.1 | 0.5 | 0.5 | 0.9 | 0.9 | ◎ |
| Application effect embodiment 10 | 88.4 | 164.2 | 90.8 | 0.5 | 0.9 | 1 | 0.1 | 1 | 0.7 | ◎ |
| Comparative effect embodiment 1 | 4.2 | 15.1 | 6.5 | 0.2 | 0.8 | 0 | 1.2 | 1.6 | 0.8 | X |
| Comparative effect embodiment 2 | 50.1 | 75.3 | 44.8 | 3.9 | 3.5 | 3 | 1.3 | 1.6 | 2.8 | X |
| Comparative effect embodiment 3 | 4.6 | 4.3 | 3.3 | 2.2 | 1.4 | 2.7 | 0 | 4.9 | 1.4 | Δ |
| Comparative effect embodiment 4 | 3.2 | 1.8 | 4 | 2.5 | 4.4 | 3.9 | 1.7 | 3.9 | 2.9 | X |
| Comparative effect embodiment 5 | 0.6 | 0.8 | 4.8 | 0.9 | 4 | 3.8 | 2.2 | 2.2 | 4.5 | X |
| Comparative effect embodiment 6 | 4.5 | 4.3 | 4.2 | 3.8 | 2.8 | 3.5 | 0.5 | 0.9 | 1.2 | X |
| Comparative effect embodiment 7 | 1.8 | 3.3 | 4.4 | 0.6 | 0.9 | 4.6 | 0.9 | 2 | 1.8 | Δ |
| Comparative effect embodiment 8 | 3.3 | 5 | 3.5 | 3.7 | 3.2 | 4.2 | 1 | 1.6 | 2 | X |
| Comparative effect embodiment 9 | 43.8 | 45.2 | 44.3 | 4 | 4.7 | 5 | 5 | 4.8 | 4.3 | Δ |
| Comparative effect embodiment 10 | 48.7 | 40.9 | 41.1 | 4.2 | 4.6 | 4.5 | 4.7 | 4.2 | 4.4 | X |
| Comparative effect embodiment 11 | 48.4 | 45.8 | 47.4 | 4.6 | 4.1 | 4.1 | 4.3 | 4 | 4.8 | Δ |
| Comparative effect embodiment 12 | 40.1 | 48.2 | 48.1 | 4.8 | 4.2 | 4.5 | 4.8 | 4.3 | 4.9 | X |
| Comparative effect embodiment 13 | 47.5 | 48.1 | 40.8 | 4 | 5 | 4.3 | 4 | 4.7 | 4.6 | Δ |
| Comparative effect embodiment 14 | 45.6 | 40.1 | 44.4 | 4.3 | 5 | 4.6 | 4.3 | 4.8 | 4.5 | X |
| Comparative effect embodiment 15 | 54.6 | 53.8 | 53.8 | 5 | 7.6 | 7.5 | 7.4 | 6.9 | 6.4 | X |
| Comparative effect embodiment 16 | 57.2 | 50.2 | 54 | 7.4 | 7.4 | 6 | 5.7 | 8 | 6.9 | X |
| Comparative effect embodiment 17 | 57.5 | 59.4 | 58.7 | 7.9 | 5.9 | 7.5 | 7 | 5.5 | 6.4 | X |
| Comparative effect embodiment 18 | 52.9 | 53.8 | 54.3 | 8 | 6.9 | 6 | 7.9 | 7.6 | 7.3 | X |
| Comparative effect embodiment 19 | 53.4 | 51.7 | 58.2 | 6 | 5.3 | 6.4 | 5.7 | 5.8 | 7.7 | Δ |
| Comparative effect embodiment 20 | 59.7 | 58.5 | 59.7 | 5.5 | 5.4 | 5.7 | 6.6 | 6.2 | 7.6 | X |
| Comparative effect embodiment 21 | 56.8 | 56.6 | 52.2 | 8 | 7.8 | 8 | 5.8 | 7 | 5 | Δ |

TABLE 5-continued

| / | TaN | TiN | WN | Cu | Co | Ta | W | Ti | TEOS | Cleaning effect |
|---|---|---|---|---|---|---|---|---|---|---|
| Comparative effect embodiment 22 | 57.4 | 50.5 | 59.7 | 6 | 5.3 | 5.4 | 6.4 | 8 | 7.8 | Δ |
| Comparative effect embodiment 23 | 53.9 | 54.7 | 56.7 | 6.8 | 5 | 5.3 | 5.7 | 7.7 | 5.1 | Δ |
| Comparative effect embodiment 24 | 52.3 | 52.4 | 59.4 | 5.3 | 7.1 | 5.4 | 6.5 | 6.8 | 6.6 | Δ |
| Comparative effect embodiment 25 | 57.1 | 52.9 | 50.6 | 5.1 | 7.8 | 5 | 6.7 | 7.1 | 6.3 | X |
| Comparative effect embodiment 26 | 52.9 | 56.5 | 56.9 | 5.3 | 5.3 | 6 | 7.4 | 7.4 | 6.2 | X |
| Comparative effect embodiment 27 | 52.4 | 52.7 | 56 | 5.1 | 6.1 | 5 | 7.6 | 6.9 | 7.6 | X |
| Comparative effect embodiment 28 | 54.4 | 50.6 | 53.7 | 6.9 | 6.6 | 5.6 | 7.9 | 5.3 | 5.8 | X |
| Comparative effect embodiment 29 | 52.1 | 53.6 | 58.8 | 7.8 | 7 | 6.6 | 5.9 | 5.6 | 8 | Δ |
| Comparative effect embodiment 30 | 54 | 51.9 | 59.4 | 5.4 | 6.5 | 6.2 | 8 | 5.1 | 5.7 | ◉ |
| Comparative effect embodiment 31 | 59.3 | 50.8 | 50.4 | 6.4 | 5.7 | 6.8 | 6.2 | 7.9 | 6.8 | Δ |
| Comparative effect embodiment 32 | 53.7 | 58.4 | 53.1 | 5.9 | 5.6 | 6.6 | 6.4 | 6 | 6.9 | ◉ |
| Comparative effect embodiment 33 | 50.8 | 55.7 | 50.4 | 6.6 | 5.2 | 7.6 | 7.8 | 5 | 7.6 | Δ |

Cleaning Effect

| | |
|---|---|
| ◉ | Completely removed |
| ○ | A small amount of residue |
| Δ | Some residue |
| X | A large amount of residue |

Comparative effect embodiments 1-33 and Effect embodiments 1-10 show that the cleaning agents of the present invention improve both etching selectivity and cleaning effect compared with the cleaning agents of the comparative embodiments.

Although the specific embodiments of the present invention are described above, a person skilled in the art should understand that these are only examples and can be changed or modified in a variety of ways without deviating from the principle and essence of the present invention. Accordingly, the scope of the present invention is defined by the appended claims.

What is claimed is:

1. A cleaning agent, wherein the cleaning agent is prepared from the following raw materials comprising the following mass fraction of components:
   1.5%-5% of an oxidant containing iodine;
   1.5%-5% of an etchant containing boron;
   10%-30% of a pyrrolidinone solvent;
   5%-10% of a corrosion inhibitor;
   0.2%-3% of a metal ion-free surfactant;
   and water, with the sum of the mass fraction of each component being 100%; the pH of the cleaning agent is 9-11; the corrosion inhibitor is selected from the group consisting of a benzotriazole corrosion inhibitor, a hydrazone corrosion inhibitor, a carbazone corrosion inhibitor and a thiocarbazone corrosion inhibitor.

2. The cleaning agent according to claim 1, wherein,
   the benzotriazole corrosion inhibitor is selected from the group consisting of benzotriazole, methylbenzotriazole and 5-carboxybenzotriazole;
   and/or, the hydrazone corrosion inhibitor is acetophenone phenylhydrazone;
   and/or, the thiocarbazone corrosion inhibitor is diphenyl-thiocarbazone.

3. The cleaning agent according to claim 1, wherein the oxidant containing iodine is selected from the group consisting of iodic acid, iodate, periodic acid and periodate.

4. The cleaning agent according to claim 3, wherein the iodate is ammonium iodate and/or tetramethylammonium iodate; and/or, the periodate is ammonium periodate and/or tetramethylammonium periodate.

5. The cleaning agent according to claim 1, wherein the etchant containing boron is selected from the group consisting of tetrafluoroboric acid, ammonium tetrafluoroborate, tetramethylammonium tetrafluoroborate, tetraethylammonium tetrafluoroborate, tetrapropylammonium tetrafluoroborate and tetrabutylammonium tetrafluoroborate; and/or, the metal ion-free surfactant is polyvinylpyrrolidinone and/or dodecylbenzenesulfonic acid.

6. The cleaning agent according to claim 1, wherein the pyrrolidinone solvent is N-hydrogen-substituted pyrrolidinone solvent.

7. The cleaning agent according to claim 6, wherein the N-hydrogen-substituted pyrrolidinone solvent is selected from the group consisting of N-methylpyrrolidinone, N-ethylpyrrolidinone, N-cyclohexylpyrrolidinone, and N-hydroxyethylpyrrolidinone.

8. The cleaning agent according to claim 1, wherein the raw materials consisting of 1.5%-5% of oxidant containing iodine, 1.5%-5% of etchant containing boron, 10%-30% of pyrrolidinone solvent, 5%-10% of corrosion inhibitor, 0.2%-3% of metal ion-free surfactant, and water, with the sum of the mass fraction of each component being 100%; the pH of the cleaning agent is 9-11.

9. A method for preparing the cleaning agent according to claim 1, which comprises mixing the raw materials of claim 1.

10. Use of the cleaning agent of claim 1 in cleaning an etched and ashed semiconductor chip.

11. The use according to claim 10, wherein, the semiconductor chip is preferably a semiconductor chip of a copper interconnect structure or an aluminum interconnect structure;

and/or, the use comprises contacting the etched and ashed semiconductor chip with the etching cleaning agent.

12. The use according to claim 10, which comprises: contacting the etched and ashed semiconductor chip with the etching cleaning agent followed by vibration, washing, and drying.

13. The use according to claim 12, wherein, the contacting temperature is 10-90° C.;

and/or, the operation of contacting is immersing the etched and ashed semiconductor chip in the cleaning liquid;

and/or, the vibration is carried out in a vortex mixer with constant temperature;

and/or, the vibration temperature is 10-90° C.;

and/or, the drying method is blowing dry with high purity nitrogen.

\* \* \* \* \*